(12) United States Patent
Niwa

(10) Patent No.: US 7,400,205 B2
(45) Date of Patent: Jul. 15, 2008

(54) FREQUENCY SYNTHESIZER AND OSCILLATION CONTROL METHOD OF FREQUENCY SYNTHESIZER

(75) Inventor: Takahiro Niwa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 82 days.

(21) Appl. No.: 11/542,594

(22) Filed: Oct. 4, 2006

(65) Prior Publication Data

US 2007/0268084 A1 Nov. 22, 2007

(30) Foreign Application Priority Data

May 16, 2006 (JP) ............... 2006-136337

(51) Int. Cl.
*H03L 7/099* (2006.01)
*G11B 5/09* (2006.01)

(52) U.S. Cl. .............. 331/34; 331/1 A; 331/8; 360/51

(58) Field of Classification Search ............ 331/1 A, 331/4, 8, 10, 11, 16–18, 25, 34, 175, 179; 327/156–159; 332/127; 360/51; 375/376; 455/188.1, 192.2, 260
See application file for complete search history.

(56) References Cited

U.S. PATENT DOCUMENTS

2007/0268084 A1* 11/2007 Niwa .................. 331/185

FOREIGN PATENT DOCUMENTS

JP 11-220388 A 8/1999

* cited by examiner

*Primary Examiner*—David Mis
(74) *Attorney, Agent, or Firm*—Arent Fox LLP

(57) ABSTRACT

The present invention provides a frequency synthesizer capable of switching an oscillation frequency band while maintaining a lock state realized with a small-scale and low-current-consumption circuit configuration, and an oscillation control method of the frequency synthesizer. A frequency synthesizer having an oscillation control circuit capable of switching an oscillation frequency band, includes: a differential bias unit for generating, as a differential bias signal, a difference in a bias signal to the oscillation control circuit caused by variations in the oscillation frequency band; a band limit detector for detecting transition of the oscillation frequency, that exceeds a limit value of the oscillation frequency band; and a transient controller for performing control of gradually shifting an output bias signal on the differential bias unit in a transient period in which operation of the differential bias unit is switched for switching the oscillation frequency band in accordance with detection of the band limit detector.

20 Claims, 8 Drawing Sheets

PRINCIPLE DIAGRAM SHOWING OPERATION PRINCIPLE OF PRESENT INVENTION

PRINCIPLE DIAGRAM SHOWING OPERATION PRINCIPLE OF PRESENT INVENTION

FUNCTIONAL BLOCK DIAGRAM SHOWING CONFIGURATION OF FREQUENCY SYNTHESIZER ACCORDING TO EMBODIMENT

FIG. 3 CIRCUIT DIAGRAM SHOWING CONCRETE EXAMPLE OF CIRCUITS OF FREQUENCY SYNTHESIZER ACCORDING TO EMBODIMENT (1)

CIRCUIT DIAGRAM SHOWING CONCRETE EXAMPLE OF CIRCUITS OF FREQUENCY SYNTHESIZER ACCORDING TO EMBODIMENT (2)

STATE TRANSIENT DIAGRAM SHOWING OPERATION OF SEQUENCE UNIT

FIG. 6  TIMING CHART SHOWING OPERATION OF FREQUENCY SYNTHESIZER ACCORDING TO EMBODIMENT

FUNCTIONAL BLOCK DIAGRAM SHOWING CONFIGURATION OF VCO CIRCUIT OF CONVENTIONAL TECHNIQUE

CIRCUIT DIAGRAM OF CONSTANT CURRENT CIRCUIT IN VCO CIRCUIT OF CONVENTIONAL TECHNIQUE

CHARACTERISTIC DIAGRAM SHOWING VCO FREQUENCY CHARACTERISTIC IN VCO CIRCUIT OF CONVENTIONAL TECHNIQUE

FREQUENCY SYNTHESIZER AND OSCILLATION CONTROL METHOD OF FREQUENCY SYNTHESIZER

CROSS-REFERENCE TO RELATED APPLICATIONS

This application is based upon and claims the benefit of priority from each of the prior Japanese Patent Application No. 2006-136337 filed on May 16, 2006, the entire contents of which are incorporated herein by reference.

BACKGROUND OF THE INVENTION

Field of the Invention

The present invention relates to a frequency synthesizer and an oscillation control method thereof. More particularly, the invention relates to a frequency synthesizer having an oscillation control circuit capable of switching an oscillation frequency band and an oscillation control method of the frequency synthesizer.

In the case of continuously accessing a recording medium such as a DVD, other optical discs, or the like, the oscillation frequency of a reference signal such as a sync signal to be sampled may vary according to the access position on the disc. This occurs because the data recording density on the inner radius side of a disc and that on the outer radius side are different from each other and, when the disc rotates at the same rotational speed, the data transfer rate on the inner radius side and that on the outer radius side are different from each other. As a frequency synthesizer that follows continuous changes in the oscillation frequency in such a reference signal, a technique is disclosed in Japanese unexamined patent publication No. H11(1999)-220388 in which oscillation control is performed stably in a wide frequency range.

In a PLL circuit disclosed in the '388 publication, as shown in FIG. 7, a voltage controlled oscillator (VCO) is constructed by a constant current circuit 107 and a current-controlled oscillator (ICO) 108. The constant current circuit 107 has a configuration as shown in FIG. 8. Resistors 116 to 120 have resistance values R5 to R1, respectively. According to signals SW1 to SW5, one of MOS transistors 111 to 115 is turned on. In the constant current circuit 107, current in a range which varies according to the MOS transistor which is turned on flows.

FIG. 9 shows a VCTRL voltage—VCO circuit frequency characteristic. By discretely varying the range of current flowing in the constant current circuit 107 for each of the signals SW1 to SW5, an overlap region is provided between neighboring VCTRL voltage—VCO circuit frequency characteristics. While suppressing each of the characteristic gradients, oscillation control in a wide frequency range is enabled. By suppressing the gradient of each characteristic curve, the oscillation frequency for an input VCTRL voltage is stabilized. By varying the current range, the invention addresses a wide frequency characteristic.

SUMMARY OF THE INVENTION

The oscillation frequency of a reference signal, however, may shift over the frequency characteristic curves shown in FIG. 9. In the '388 publication, the signals SW1 to SW5 are switched to switch a transistor which is turned on among the MOS transistors 111 to 115, and the current range is accordingly switched.

The current range is switched by shifting the upper limit value of the VCTRL voltage to the lower limit value of the VCRL voltage of the immediately upper characteristic curve or shifting the lower limit value of the VCTRL voltage to the upper limit value of the VCRL voltage of the immediately lower characteristic curve. In any of the cases, the VCTRL voltage largely changes before and after the switch of the current range. In the case of forming a PLL circuit by using the VCO disclosed in the '388 publication, it may take time until the PLL circuit which temporarily looses a lock state due to the change in the VCTRL voltage is stabilized in a lock state according to the VCTRL voltage after the change. During the period, an access to a medium may be interrupted, and this is a problem.

To avoid such a problem, a plurality of PLL circuits may be provided and an oscillation control circuit is set for current ranges which are neighboring each other. When a frequency characteristic fluctuation over the characteristic curves is addressed by switching selection of the PLL circuits, the transition of the oscillation frequency of a reference signal can be followed without requiring switch time. In this case, however, there is a problem that the circuit occupation area and current consumption may become enormous. There is another problem such that the oscillation characteristic may deteriorate due to instability of an oscillation signal caused by interference among the PLL circuits.

The present invention has been achieved in consideration of the background art and an object of the invention is to provide a frequency synthesizer capable of switching an oscillation frequency band while maintaining a lock state realized with a small-scale and low-current-consumption circuit configuration.

To achieve the above object, there is provided a frequency synthesizer having an oscillation control circuit capable of switching an oscillation frequency band, comprising: a differential bias unit for generating, as a differential bias signal, a difference in bias signals to the oscillation control circuit caused by variations in the oscillation frequency band; a band limit detector for detecting that the oscillation frequency exceeds a predetermined value according to the oscillation frequency band; and a transient controller for performing control of gradually shifting a bias signal which is outputted, on the differential bias unit in a transient period in which the differential bias unit is controlled in accordance with detection of the band limit detector.

The frequency synthesizer of the invention can switch the oscillation frequency band of the oscillation control circuit by generating, as a differential bias signal, the difference of bias signals to the oscillation control circuit according to the oscillation frequency bands by the differential bias unit. When the band limit detector detects that the oscillation frequency exceeds a predetermined value according to the oscillation frequency band, the operation switching of the differential bias unit starts. In the transient period, the transient controller performs control of gradually shifting the bias signal to be outputted to the differential bias unit.

There is also provided an oscillation control method of a frequency synthesizer capable of switching an oscillation frequency band, comprising: a step of detecting that the oscillation frequency exceeds a predetermined value according to the oscillation frequency band; and a step of gradually shifting a bias signal which sets the oscillation frequency band in accordance with the step of detecting the band.

In the oscillation control method of the frequency synthesizer of the invention, when it is detected that the oscillation frequency exceeds a predetermined value according to the oscillation frequency band in a frequency synthesizer capable of switching the oscillation frequency band, a bias signal for setting an oscillation frequency band is gradually shifted.

When the differential bias unit generates a differential bias signal as a difference of bias signals necessary for the oscillation controller in accordance with the oscillation frequency band, the differential bias unit can be controlled transiently. The bias signal is gradually shifted, a signal value changes step by step, and the oscillation frequency band can be gradually changed step by step.

The oscillation frequency band can be switched step by step continuously. In the transient period of the switch of the oscillation frequency band, the state in which the oscillation frequency band switches discontinuously and the frequency synthesizer is unlocked can be suppressed. Also in the transient period in which the oscillation frequency band is switched, the lock state can be maintained.

The frequency synthesizer capable of maintaining the lock state also in the transient period in which the oscillation frequency band is switched can be realized without making the circuit configuration redundant. With a small-scale circuit configuration, low power consumption current operation can be performed. Further, irrespective of the transient period and the normal state, a stable output signal of the oscillation frequency can be outputted.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

An embodiment of a frequency synthesizer of the present invention will be described in detail hereinbelow with reference to FIGS. 1 to 6.

Figure 1:
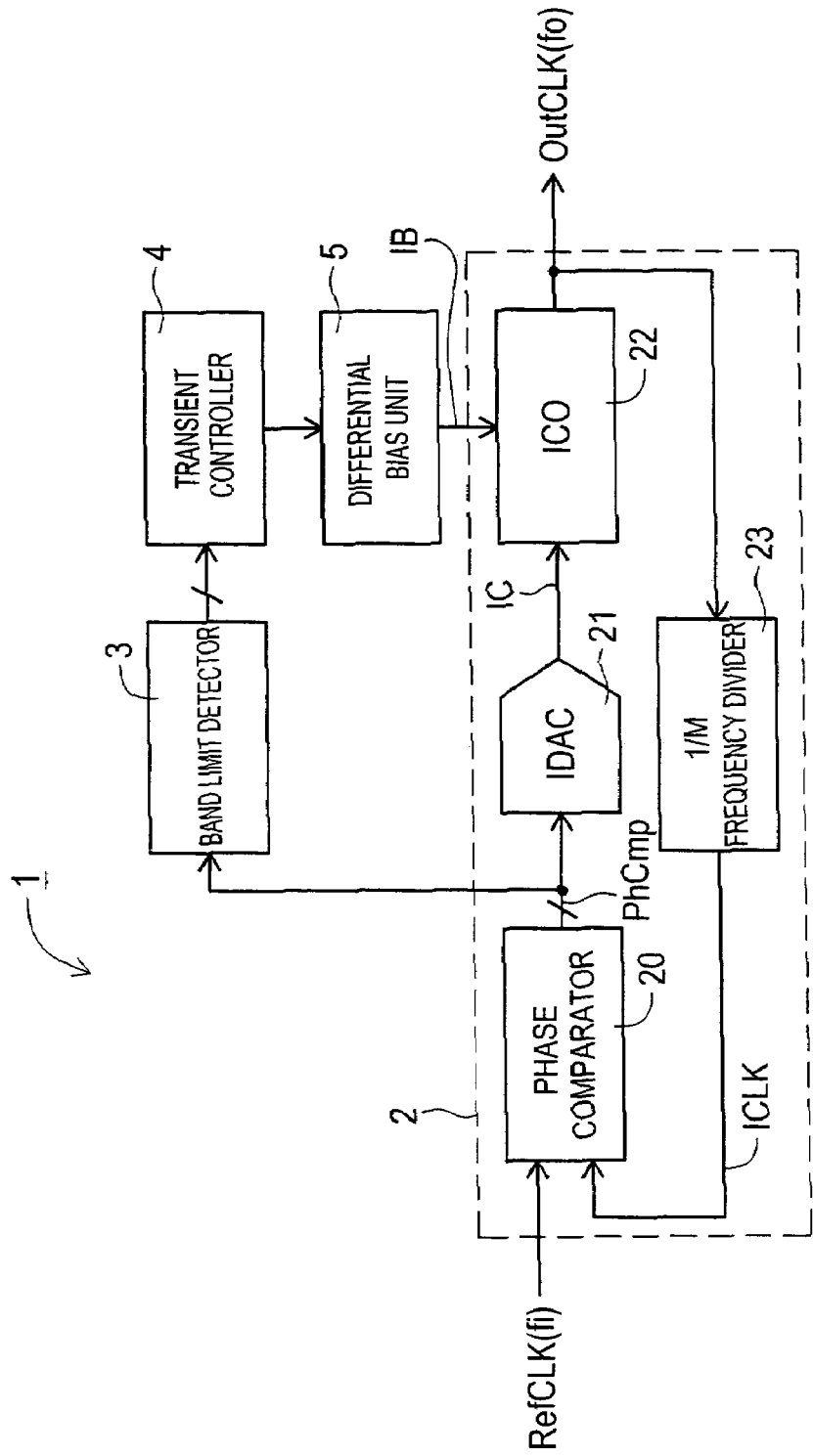
FIG. 1 is a principle diagram showing the operation principle of the present invention.

FIG. 1 is a principle diagram showing the principle of the invention of a frequency synthesizer 1 according to the present invention. When the frequency of a reference clock RefCLK that is inputted changes, the frequency synthesizer 1 detects whether the frequency of an output clock OutCLK lies in a predetermined range or not. In the case where the frequency of the output clock OutCLK is not included in the predetermined range, the frequency synthesizer 1 continuously changes the oscillation characteristic of an oscillation control circuit to switch the oscillation frequency band.

The frequency synthesizer 1 has an oscillation control circuit 2 capable of switching an oscillation frequency band fb, and a differential bias unit 5 for generating, as a differential bias signal ΔIB, the difference between bias signals IB due to variations in an oscillation frequency band fb to the oscillation control circuit 2. The frequency synthesizer 1 also has a band limit detector 3 for detecting that oscillation frequency fo of the output clock OutCLK exceeds a predetermined value according to the frequency band fb, and a transient controller 4 for performing control of gradually shifting the bias signal IB outputted from the differential bias unit 5 in a transient period in which the bias unit is controlled in accordance with detection of the band limit detector 3.

The oscillation control circuit 2 has a phase comparator 20, an IDAC 21, an ICO 22, and a 1/M frequency divider 23. The phase comparator 20 compares the phase of the reference clock RefCLK and the phase of an internal clock ICLK outputted from the 1/M frequency divider 23, and outputs a phase difference value PhCmp as a digital code according to the phase difference.

The IDAC 21 outputs a bias current IC according to the phase difference value PhCmp. The ICO 22 outputs the output clock OutCLK of the oscillation frequency according to the bias current IC and the bias signal IB from the differential bias unit 5. The 1/M frequency divider 23 divides the frequency of the output clock OutCLK to 1/M.

With the configuration, the oscillation control circuit 2 outputs the output clock OutCLK as the oscillation frequency fo which is M times as high as an input frequency fi of the reference clock RefCLK by a PLL (Phase Locked Loop). The bias signal IB is supplied from the differential bias unit 5 to switch the oscillation frequency band fb of the oscillation control circuit 2.

In the frequency synthesizer 1 of the invention, the difference of the bias signal IB to the oscillation control circuit caused by variations in the oscillation frequency band is generated as the differential bias signal ΔIB by the differential bias unit 5, thereby enabling the oscillation frequency band fb of the oscillation control circuit 2 to be switched. When the band limit detector 3 detects that the oscillation frequency fo exceeds a predetermined value according to the oscillation frequency band fb, switching of the operation of the differential bias unit 5 starts. In the transient period, the transient controller 4 performs control of gradually shifting the bias signal IB outputted from the differential bias unit 5.

When the differential bias unit 5 generates the differential bias signal ΔIB as the variation of the bias signal IB necessary for the oscillation control circuit 2 in accordance with the variations in the oscillation frequency band fb, the differential bias unit 5 can be transiently controlled. By the control of gradually shifting the bias signal, the oscillation frequency band fb can be gradually changed.

Figure 2:
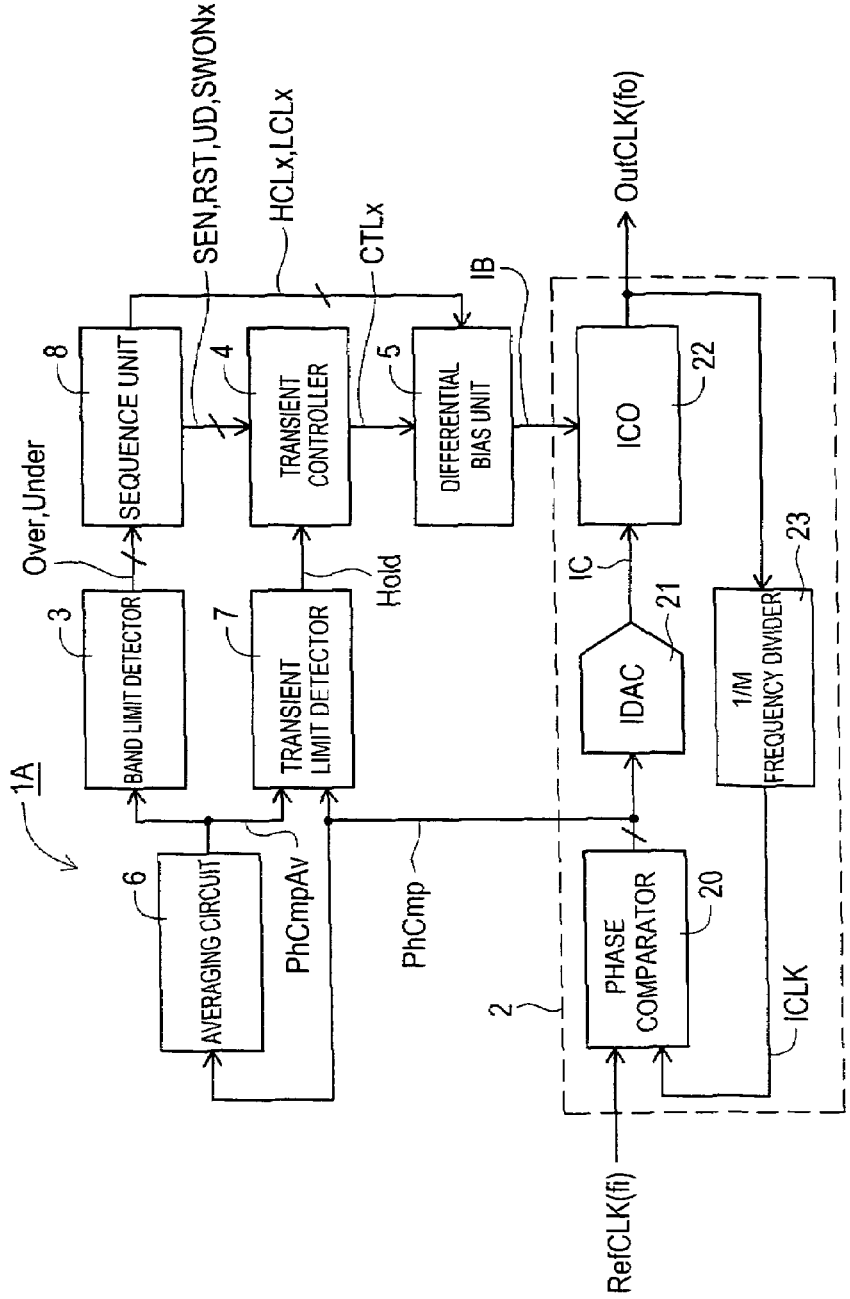
FIG. 2 is a functional block diagram showing the configuration of a frequency synthesizer according to an embodiment.

A frequency synthesizer 1A according to the embodiment of the invention will be described with reference to FIGS. 2 to 6. FIG. 2 is a functional block diagram showing the configuration of the frequency synthesizer according to the embodiment. The frequency synthesizer 1A has the oscillation control circuit 2, the band limit detector 3, the transient controller 4, the differential bias unit 5, an averaging circuit 6, a transient limit detector 7, and a sequence unit 8.

The averaging circuit 6 outputs a phase difference average value PhCmpAv as an average value of output codes of the phase difference values PhCmp. Concretely, the phase difference average value PhCmpAv is a so-called moving average value of the phase difference value PhCmp obtained by sampling the phase difference value PhCmp a few times, accumulating the sampled values, and dividing the accumulated value by the number of sampling times. The phase difference average value PhCmpAv is held in the averaging circuit 6 until the next phase difference value PhCmp is sampled.

In the band limit detector 3, the phase difference average value PhCmpAv is compared with an upper limit value Upper and a lower limit value Lower which are preset. When the phase difference average value PhCmpAv exceeds the upper limit value Upper, an upper limit detection signal Over is outputted. When the phase difference average value PhCmpAv is below the lower limit value Lower, a lower limit detection signal Under is outputted.

Figure 3:
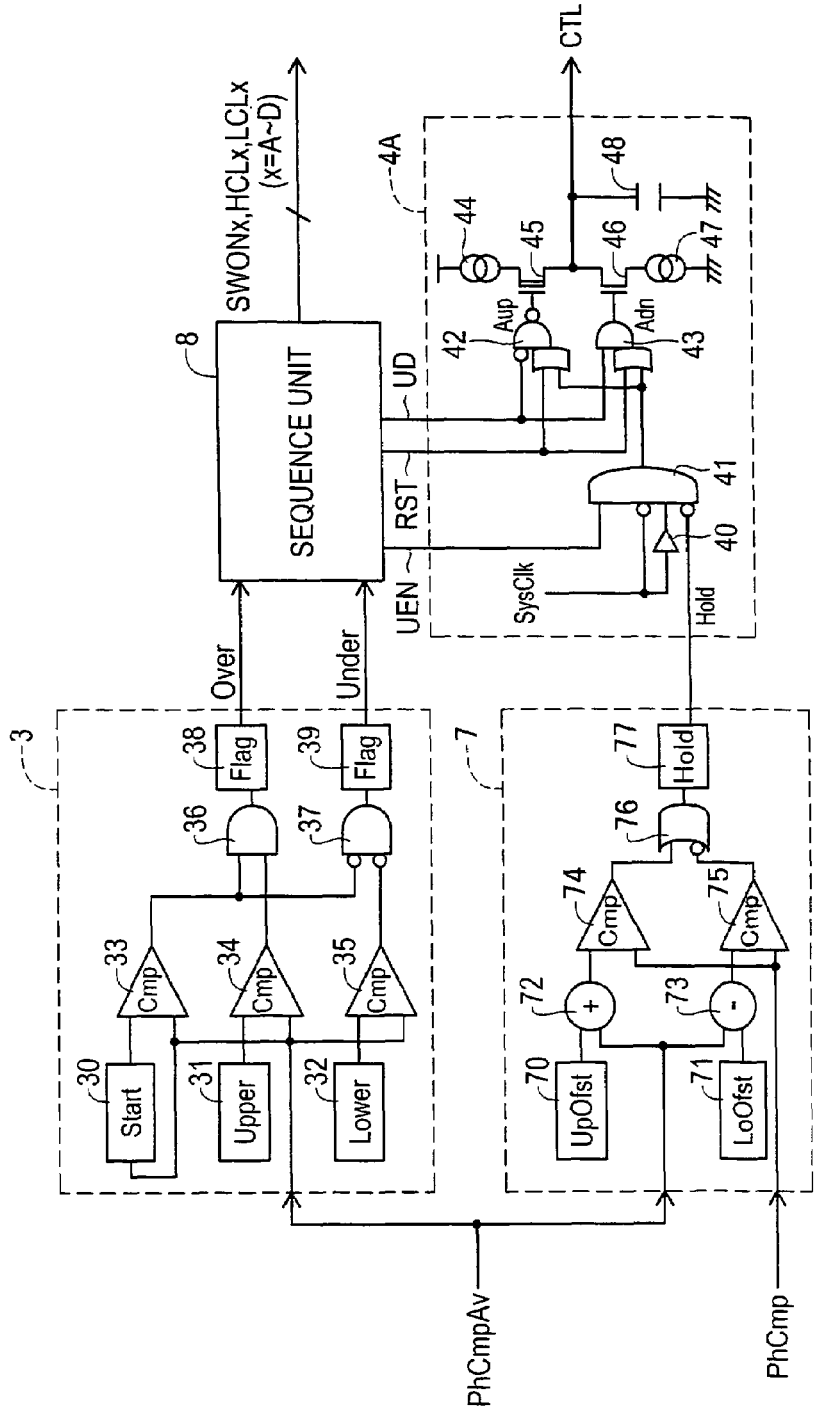
FIG. 3 is a circuit diagram showing a concrete example of circuits of the frequency synthesizer according to the embodiment.

As shown in FIG. 3, the band limit detector 3 has an initial value storing unit 30 for storing an initial value Start and a comparator 33 for comparing the phase difference average value PhCmpAv with the initial value Start. As the initial value Start, immediately after start or immediately after switch of the oscillation frequency band fb, the phase difference average value PhCmpAv in the case where the PLL of the oscillation control circuit 2 is locked is stored.

The comparator 33 outputs a high-level signal in the case where the phase difference average value PhCmpAv exceeds the initial value Start, and outputs a low-level signal in the case where the phase difference average value PhCmpAv is below the initial value Start. The comparator 33 detects whether the phase difference average value PhCmpAv immediately after start or immediately after switch of the oscillation frequency band fb changes in the positive direction or the negative direction.

The band limit detector 3 has an upper limit value storing unit 31 for storing the upper limit value Upper, a lower limit value storing unit 32 for storing the lower limit value Lower, a comparator 34 for comparing the phase difference average value PhCmpAv with the upper limit value Upper, and a comparator 35 for comparing the phase difference average value PhCmpAv with the lower limit value Lower.

When the phase difference average value PhCmpAv exceeds the upper limit value Upper, the comparator 34 outputs the high level. When the phase difference average value PhCmpAv is below the lower limit value Lower, the comparator 35 outputs the low-level signal. The upper limit value Upper and the lower limit value Lower are fixed values which are preset according to the characteristic of the oscillation control circuit 2 by a not-shown CPU before start of the frequency synthesizer 1A.

Further, the band limit detector 3 has gate circuits 36 and 37 and flag output circuits 38 and 39. One end of the gate circuit 36 is connected to the output of the comparator 33, and the other end of the gate circuit 36 is connected to the output of the comparator 34. In the case where both of the output of the comparator 33 and the output of the comparator 34 are at the high level, a high-level signal is outputted from the gate circuit 36. In other words, when a change in the phase difference average value PhCmpAv is in a positive direction and the phase difference average value PhCmpAv exceeds the upper limit value Upper, a high-level signal is outputted. When an output of the gate circuit 36 is at the high level for predetermined time, the flag output circuit 38 outputs the upper limit detection signal Over.

One end of the gate circuit 37 is connected to the output of the comparator 33, and the other end of the gate circuit 37 is connected to the output of the comparator 35. In the case where both of the output of the comparator 33 and the output of the comparator 35 are at the low level, a high-level signal is outputted from the gate circuit 37. In other words, when a change in the phase difference average value PhCmpAv is in a negative direction and the phase difference average value PhCmpAv is below the lower limit value Lower, a high-level signal is outputted. When an output of the gate circuit 37 is at the high level for predetermined time, the flag output circuit 39 outputs the lower limit detection signal Under.

Next, the transient limit detector 7 will be described. The transient limit detector 7 detects whether transient of the oscillation frequency fo in the oscillation control circuit 2 exceeds the predetermined value or not. In the case where the transient of the oscillation frequency fo exceeds the predetermined value, a hold signal Hold is outputted.

As shown in FIG. 3, the transient limit detector 7 has a positive offset value storing unit 70 for storing a positive offset value UpOfst, a negative offset value storing unit 71 for storing a negative offset value LoOfst, an adder 72 for adding the positive offset value UpOfst to the phase difference average value PhCmpAv, and a subtracter 73 for subtracting the negative offset value LoOfst from the phase difference average value PhCmpAv.

The transient limit detector 7 also has a comparator 74 for comparing an output of the adder 72 and the phase difference value PhCmp, a comparator 75 for comparing an output of the subtracter 73 and the phase difference value PhCmp, a gate circuit 76 for receiving inputs from the comparators 74 and 75, and a stop signal generator 77.

The comparator 74 outputs a high-level signal when the phase difference value PhCmp exceeds an output of the adder 72. The comparator 75 outputs a low-level signal when the phase difference value PhCmp becomes below the output of the subtracter 73. The gate circuit 76 outputs a high-level signal when an output of the comparator 74 is at the high level or when an output of the comparator 75 is at the low level. When an output of the gate circuit 76 is at the high level for predetermined time, the stop signal generator 77 outputs a high-level hold signal Hold.

Next, the transient controller 4 will be described. The transient controller 4 outputs a transient control signal CTL in accordance with the control of the sequence unit 8. When the hold signal Hold is outputted from the transient limit detector 7, the transient controller 4 temporarily holds the transient control of the transient control signal CTL.

The transient controller 4 has a transient control signal generator 4A (refer to FIG. 3) for generating the transient control signal CTL, and a selector 4B (refer to FIG. 4) for selectively outputting the transient control signal CTL to each of the differential bias circuits in the differential bias unit 5.

As shown in FIG. 3, the transient control signal generator 4A has a delay element 40, gate circuits 41, 42, and 43, constant current sources 44 and 47, a P-type transistor 45, an N-type transistor 46, and a capacitor 48. To the gate circuit 41, an update enable signal UEN from the sequence unit 8, an inversion signal of a system clock signal SysClk, an output of the delay element 40, and an inversion signal of the hold signal Hold are supplied. In the case where the update enable signal UEN is at the high level and the hold signal Hold is at the low level, the gate circuit 41 outputs a positive pulse signal having a delay value of the delay element 40 as a pulse width every rising edge of the system clock signal SysClk.

To the gate circuit 42, the up/down control signal UD, a reset signal RST, and an output of the gate circuit 41 are supplied. In the case where the up/down control signal UD is at the low level and the reset signal RST is at the low level, a positive pulse signal from the gate circuit 41 is inverted, and a negative pulse signal is outputted as a drive signal Aup. In the case where the up/down control signal UD is at the low level and the reset signal RST is at the high level, the drive signal Aup at the low level is outputted. In the other cases, the drive signal Aup at the high level is outputted.

To the gate circuit 43, the up/down control signal UD from the sequence unit 8, the reset signal RST, and an output of the gate circuit 41 are supplied. In the case where the up/down control signal UD is at the high level and the reset signal RST is at the low level, a positive pulse signal from the gate circuit 41 is outputted as a drive signal Adn. In the case where the up/down control signal UD is at the high level and the reset signal RST is at the high level, the high-level drive signal Adn is outputted. In the other cases, the low-level drive signal Adn is outputted.

To the gate of the P-type transistor 45, the drive signal Aup is supplied. In the case where the drive signal Aup is at the low level, the capacitor 48 is charged with current from the constant current source 44 via the P-type transistor 45. To the gate of the N-type transistor 46, the drive signal Adn is supplied. In the case where the drive signal Adn is at the high level, the capacitor 48 is discharged by current to the constant current source 47 via the N-type transistor 46. The potential of the transient control signal CTL is determined according to the amount of charges accumulated in the capacitor 48. Therefore, the potential of the transient control signal CTL can be controlled by control of charging/discharging of the capacitor 48.

Figure 4:
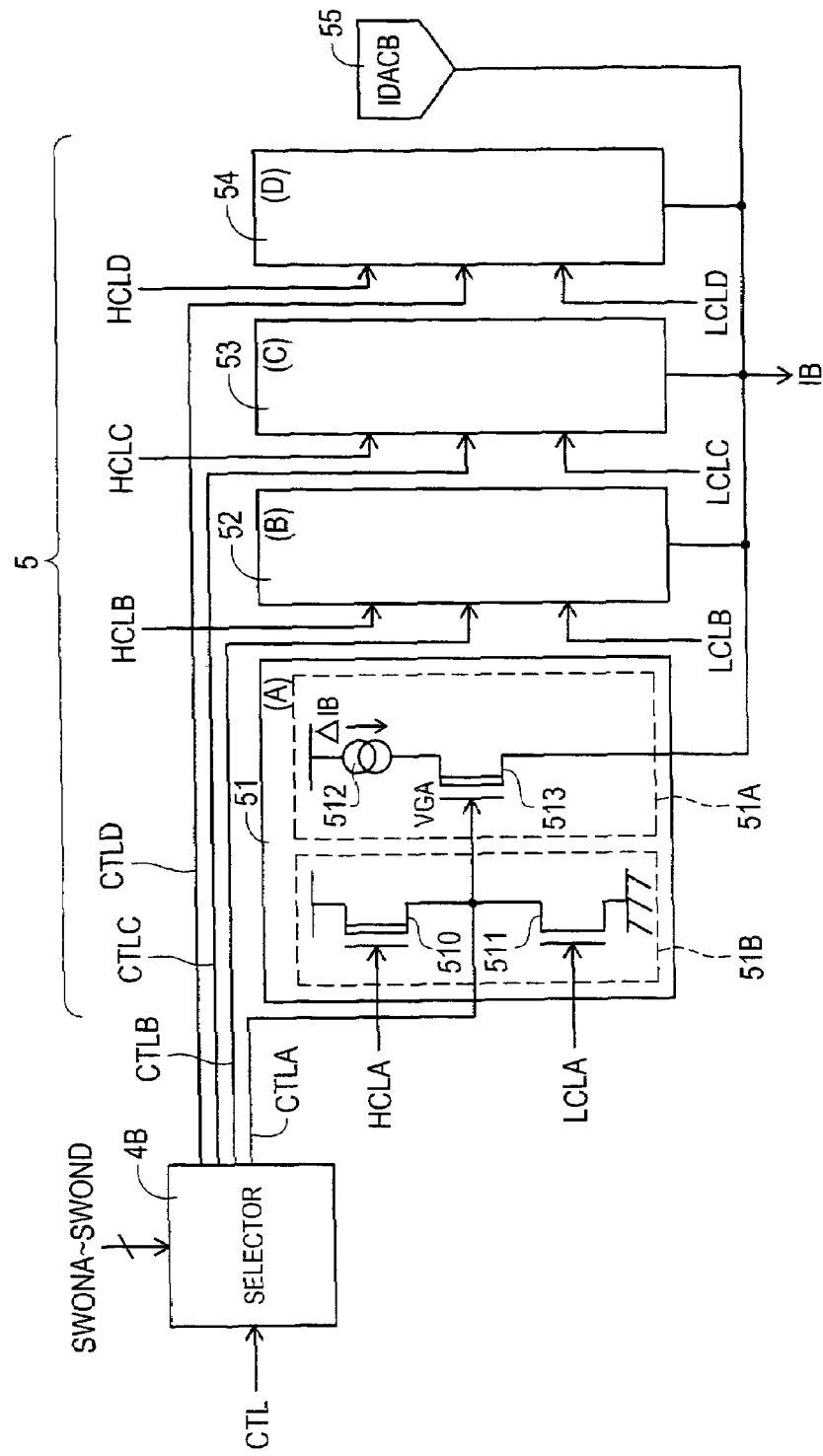
FIG. 4 is a circuit diagram showing a concrete example of circuits of the frequency synthesizer according to the embodiment.

As shown in FIG. 4, the selector 4B receives the transient control signal CTL and outputs transient control signals CTLA to CTLD in accordance with selection signals SWONA to SWOND from the sequence unit 8. Concretely, when the high-level selection signals SWONA to SWOND are inputted, the transient control signal CTL is transmitted as corresponding transient control signals CTLA to CTLD.

Next, the differential bias unit 5 will be described. As shown in FIG. 4, the differential bias unit 5 has differential bias circuits 51 to 54 and an IDACB 55. In the differential bias unit 5, output current values from the differential bias circuits 51 to 54 are added to the current outputted from the IDACB 55, and the bias signal IB is outputted.

The differential bias circuits 51 to 54 have the same configuration. Therefore, the details of only the differential bias circuit 51 will be described, and the details of the differential bias circuits 52 to 54 will not be described.

The differential bias circuit 51 has a P-type transistor 510, an N-type transistor 511, a constant current source 512, and a P-type transistor 513. In the P-type transistor 510, the gate is connected to a control signal HCLA, the source is connected to the power source potential, and the drain is connected to the transient control signal CTLA. In the N-type transistor 511, the gate is connected to the control signal LCLA, the source is connected to the ground potential, and the drain is connected to the transient control signal CTLA. In the constant current source 512 which outputs the differential bias signal $\Delta$IB, a high-voltage-side terminal is connected to the power source potential, and an output-side terminal is connected to the source of the P-type transistor 513. In the P-type transistor 513, the gate is connected to the transient control signal CTLA, and the drain is connected to the IDACB 55.

In a state where the transient control signal CTLA is not outputted (high impedance state), when the control signals HCLA and LCLA are at the low level, a high-level signal is applied to the gate of the P-type transistor 513, and the P-type transistor 513 is in a nonconductive state. Consequently, the differential bias signal $\Delta$IB is not added to the bias signal IB.

On the other hand, when both of the control signals HCLA and LCLA are at the high level, a low-level signal is applied to the gate of the P-type transistor 513, and the P-type transistor 513 is made conductive. Consequently, the differential bias signal $\Delta$IB is added to the bias signal IB.

In the case where the control signal HCLA is at the high level and the control signal LCLA is at the low level, the P-type transistor 513 is bias-controlled, and current according to the transient control signal CTLA is added to the bias signal IB.

The differential bias signal $\Delta$IB is set so that the upper limit value of the oscillation frequency of the ICO 22 in the case where the bias signal IB is added and the lower limit value of the oscillation frequency band of the ICO 22 in the case where "the bias signal IB+the differential bias signal $\Delta$IB" is added overlap each other. When the oscillation frequency band fb of the ICO 22 in the case of the bias signal IB outputted from the IDACB 55 is equal to N−2, by adjusting the output of the differential bias signals $\Delta$IB from the differential bias circuits 51 to 54, the oscillation frequency band fb can be set to N−2 to N+2. For example, at the time of switching N−2 to N+1, a transient control signal CTLx (x=A to D) is gradually changed from the low level to the high level and supplied. It can suppress the situation such that the oscillation frequency band fb is continuously switched and the frequency synthesizer 1A becomes out of the lock state.

Figure 5:
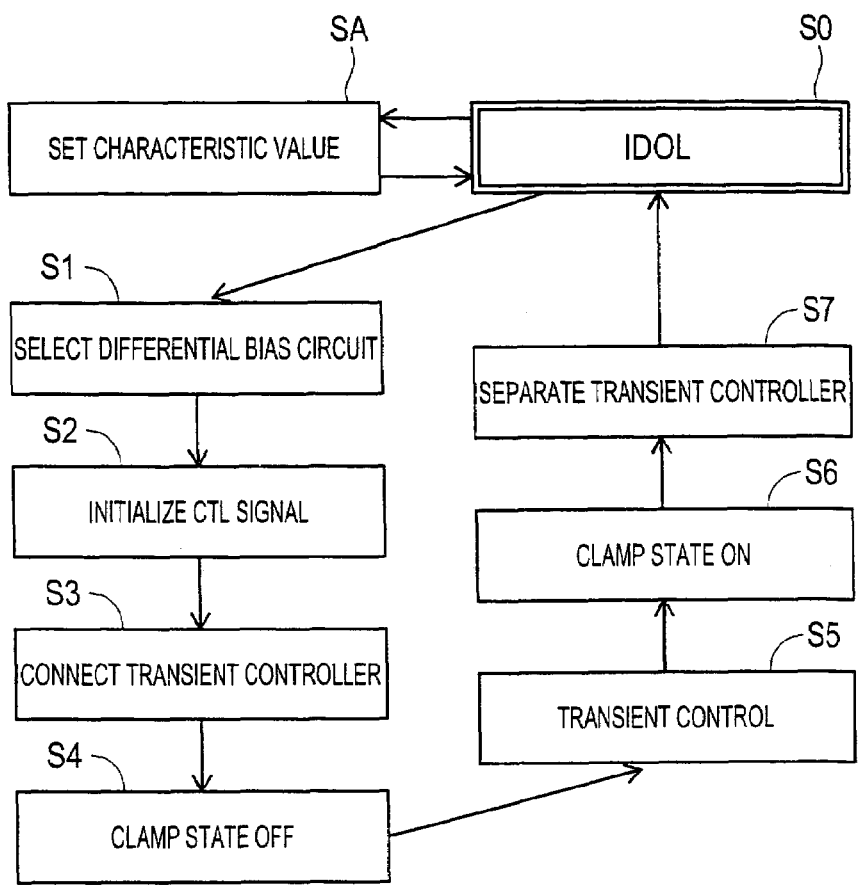
FIG. 5 is a state transient diagram showing operation of a sequence unit.

The sequence unit 8 will now be described with reference to FIG. 5. FIG. 5 is a state transient diagram showing the operation of the sequence unit 8.

First, state S0 is an idle state in which the ICO 22 operates in the oscillation frequency band fb of N−2. At the time of setting the oscillation frequency band fb in the frequency synthesizer 1A, in state SA, the IDACB 55 is set so that the oscillation frequency band fb of the ICO 22 becomes N−2, and the sequence of a series of operations in the sequence unit 8 is initialized. Specifically, all of a selection control signal SWONx, a control signal HCLx, a control signal LCLx, the update enable signal UEN, the reset signal RST, and the up/down control signal UD are set to the low level. When a command of shifting the oscillation frequency band fb is supplied from the outside, the sequence unit 8 shifts to state S1.

In the state S1, a differential bias circuit 5x (x=1 to 4) that gradually changes the bias signal IB is selected. In the example, the case where the selected bias circuit 5x is the differential bias circuit 51 will be described. After that, the sequence unit 8 shifts to state S2.

In the state S2, the transient control signal CTL is initialized to the same level as that of a gate voltage VGA of the P-type transistor 513 in the selected differential bias circuit 51. For example, in the case where the gate voltage VGA is at the high level, the low-level up/down control signal UD and the high-voltage reset signal RST are outputted, and the transient control signal CTL is set to the high level. In the case where the gate voltage VGA is at the low level, the high-level up/down control signal UD and the high-level reset signal RST are outputted, and the low-level transient control signal CTL is outputted. Subsequently, the sequence unit 8 shifts to state S3.

In the state S3, the transient control signal CTL outputted from the transient controller 4 is connected to the selected differential bias circuit 51. Concretely, the selection control signal SWONA shifts to the high level and the level of the transient control signal CTL is transmitted as the transient control signal CTLA. After that, the sequence unit 8 shifts to state S4.

In the state S4, the clamp state in which either the P-type transistor 510 or the N-type transistor 511 is made conductive is cancelled. Concretely, the control signal HCLA is set to the high level, and the control signal LCLA is set to the low level. Subsequently, the sequence unit 8 shifts to state S5.

In the step S5, transient control of the transient control signal CTL is performed. Concretely, the update enable signal UEN is set to the high level, the reset signal RST is set to the low level, and the up/down control signal UD is outputted according to the direction of change in the voltage level of the transient control. In the case where the initial value of the transient control signal CTL is at the high level, the up/down control signal UD becomes at the high level. By a positive pulse signal from the drive signal Adn, the capacitor 48 is discharged, and the potential of the transient control signal CTL gradually decreases. On the other hand, in the case where the initial value of the transient control signal CTL is at the low level, the up/down control signal UD becomes low level. By a negative pulse signal from the drive signal Aup, the capacitor 48 is charged, and the potential of the transient control signal CTL gradually increases. In any of the cases, when the hold signal Hold is inputted, the pulse signal from the drive signal Aup or the drive signal Adn is temporarily stopped. Therefore, a change in the potential of the transient control signal CTL is also temporarily stopped. When the potential of the transient control signal CTL reaches the potential opposite to that of the initial value, the sequence unit 8 shifts to state S6.

In state S6, either the P-type transistor 510 or the N-type transistor 511 is clamped. Concretely, control is performed so that the potential of the transient control signal CTL becomes equal to the final potential of the transient control of the gate voltage VGA. In the case where the gate voltage VGA after the transient control is at the high level, the control signal HCLA is set to the low level and the P-type transistor 510 is clipped. In the case where the gate voltage VGA is at the low level, the control signal LCLA is set to the high level, and the N-type transistor 511 is clipped. Subsequently, the sequence unit 8 shifts to state S7.

In the state S7, the transient control signal CTL outputted from the transient controller 4 is separated from the differential bias circuit 51. Concretely, the selection control signal SWONA shifts to the low level, thereby setting the transient control signal CTLA to the high impedance. The series of transient control completes and the sequence unit 8 returns to the state S1.

Figure 6:
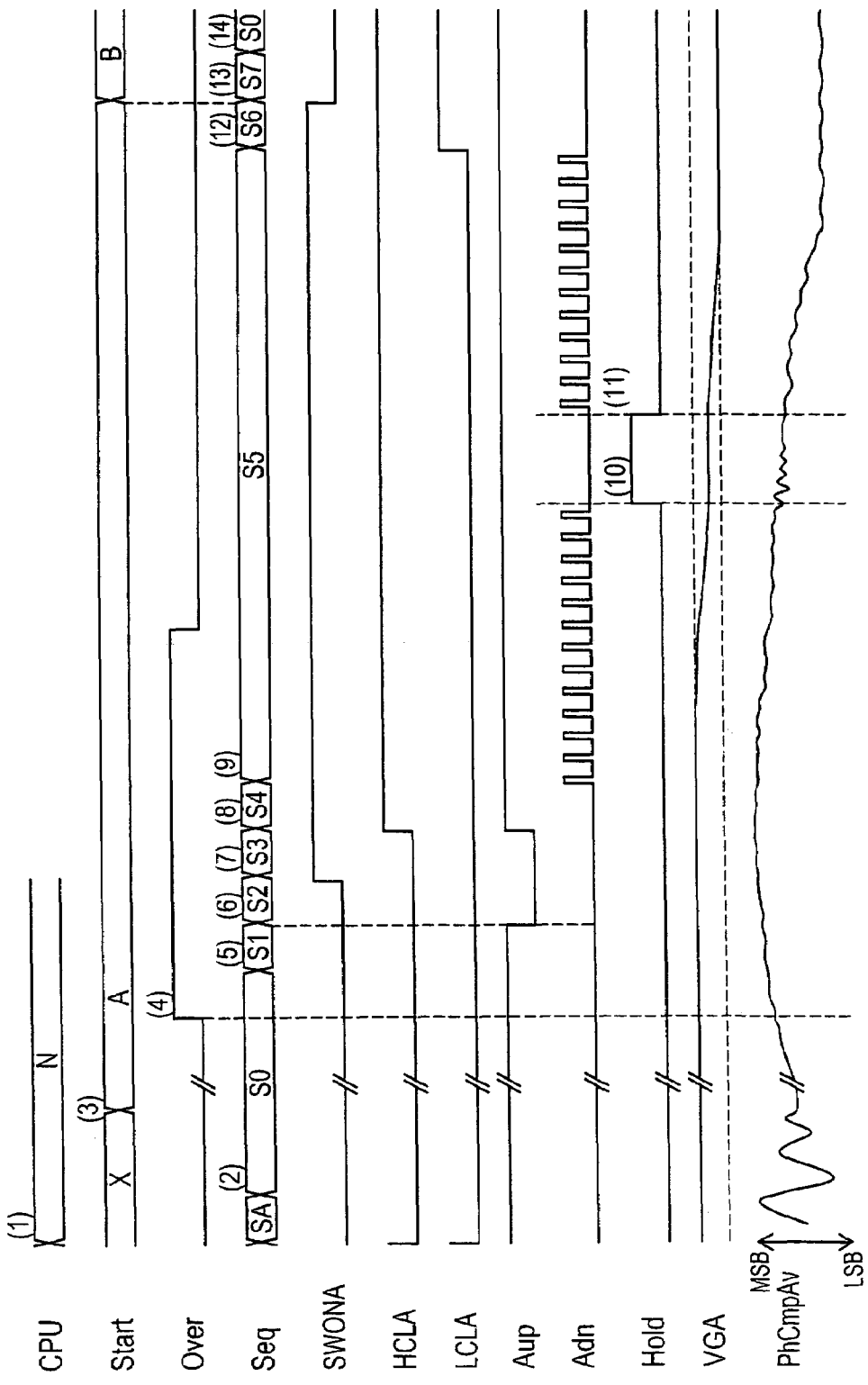
FIG. 6 is a timing chart showing operation of the frequency synthesizer according to the embodiment.
Figure 7:
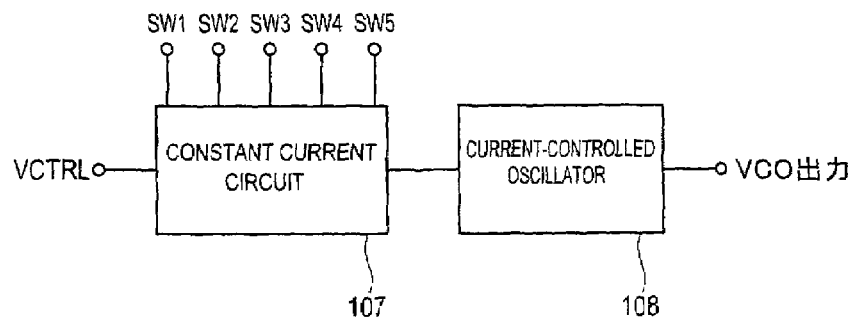
FIG. 7 is a functional block diagram showing the configuration of a VCO circuit of a conventional technique.
Figure 8:
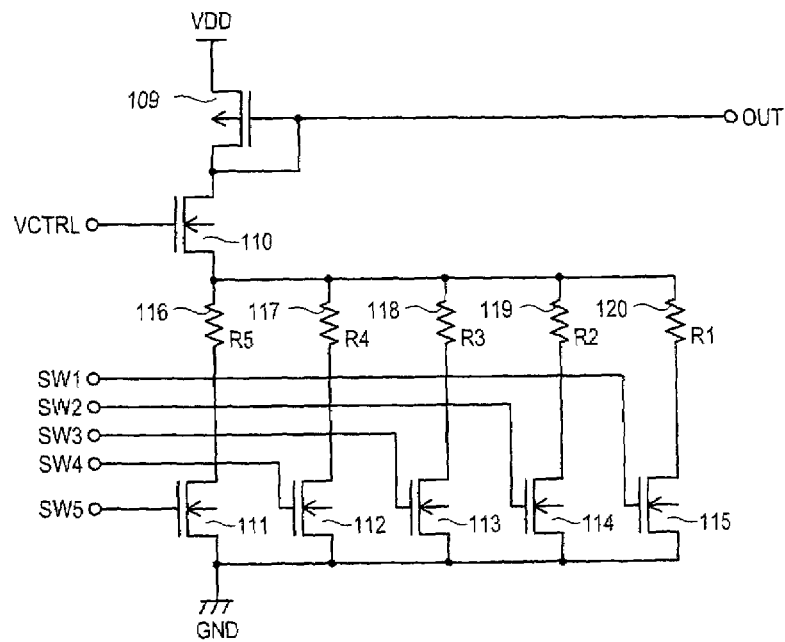
FIG. 8 is a circuit diagram of a constant current circuit in the VCO circuit of the conventional technique.
Figure 9:
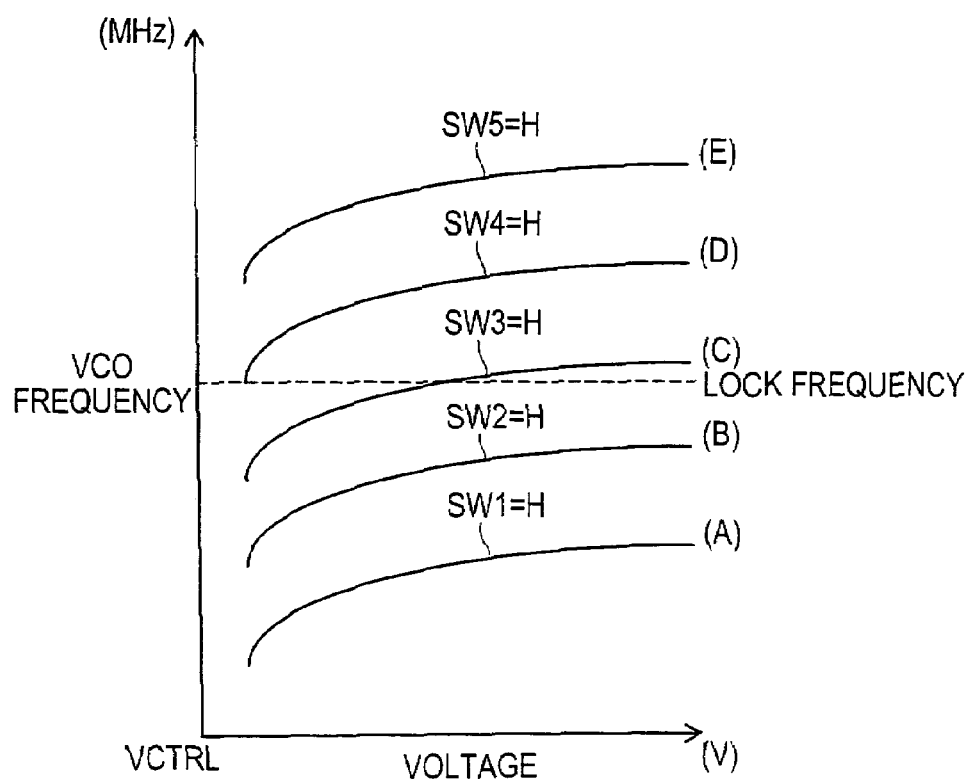
FIG. 9 is a characteristic diagram showing the VCO frequency characteristic in the VCO circuit of the conventional technique.

Next, referring to FIG. 6, the operation of the frequency synthesizer 1A will be described. FIG. 6 is a timing chart showing operations of the frequency synthesizer 1A according to the embodiment.

The operation timings relate to the case that, since input frequency fi of the reference clock RefCLK gradually increases and exceeds the upper limit of the oscillation frequency band fb of N−2, transient control of making the P-type transistor 513 of the differential bias circuit 51 conductive is performed.

In the timing chart, "CPU" shows an operation state of the frequency synthesizer 1A by a not-shown CPU, "Start" shows a start state of the frequency synthesizer 1A, and "Seq" indicates a state of the sequence unit 8.

In (1), the CPU enables the operation of the frequency synthesizer 1A, thereby shifting the state of the sequence unit 8 to the state SA and initializing the states of the IDACB 55 and the sequence unit 8.

In (2), when the state SA completes, the sequence unit 8 shifts to the state S0, and the frequency synthesizer 1A enters an idle state. Further, in (3), by a command from the CPU or other access start control logic, the frequency synthesizer 1A starts. The sequence unit 8 becomes able to receive the upper limit detection signal Over and the lower limit detection signal Under.

In (4), as the input frequency fi of the reference clock RefCLK increases, the phase difference average value PhCmpAv increases. When the phase difference average value PhCmpAv reaches the upper limit value Upper, the upper limit detection signal Over is outputted. It makes the state of the sequence unit 8 shift to the state S1.

In (5), when the sequence unit 8 shifts to the state S1, the sequence unit 8 determines the differential bias circuit 51 as the target of transient control, and shifts to the state S2.

In (6), when the sequence unit 8 shifts to the state S2, the sequence unit 8 outputs the high-level reset signal RST, the low-level up/down control signal UD, and the low-level drive signal Aup. The capacitor 48 is charged and the high-level transient control signal CTL is outputted.

In (7), when the sequence unit 8 shifts to the state S3, the sequence unit 8 outputs the high-level selection control signal SWONA, and the transient control signal CTL is transmitted to the gate voltage VGA via the transient control signal CTLA.

In (8), when the sequence unit 8 shifts to the state S4, the sequence unit 8 outputs the high-level control signal HCLA and the clip state of the P-type transistor 510 is canceled. The low-level reset signal RST is outputted, and the drive signal Aup is set to the high level. Consequently, charging of the capacitor 48 is stopped. However, the charges in the capacitor 48 are held, and the transient control signal CTL maintains the high level.

In (9), when the sequence unit 8 shifts to the state S5, the sequence unit 8 outputs the high-level update enable signal UEN and the high-level up/down control signal UD, and the positive pulse signal is outputted as the drive signal Adn. Therefore, the capacitor 48 is intermittently discharged and the transient control signal CTL and the gate voltage VGA gradually decrease. Thus, the bias signal IB gradually increases, and the oscillation frequency band becomes high, so that the output current IC of the IDAC 21 for making oscillation at a frequency at which the phase is to be locked becomes relatively low, and the absolute value of the phase difference average value PhCmpAv gradually decreases.

In (10), when the transition amount of the phase difference value PhCmp increases and exceeds a value obtained by adding the positive offset value UpOfst to the phase difference average value PhCmpAv or a value obtained by subtracting the negative offset value LoOfst from the phase difference average value PhCmpAv, the hold signal Hold is outputted, and outputting of the positive pulse signal of the drive signal Adn is temporarily stopped. Consequently, decrease in the gate voltage VGA stops and the voltage value is held. As described above, by regulating the transition amount of the phase difference average value PhCmpAv, the PLL in the oscillation control circuit 2 can be prevented from being unlocked.

In (11), when the transition amount of the phase difference average value PhCmpAv becomes below a value obtained by adding the positive offset value UpOfst to the phase difference average value PhCmpAv or a value obtained by subtracting the negative offset value LoOfst from the phase difference average value PhCmpAv, the hold signal Hold is released, and the positive pulse signal of the drive signal Adn is outputted again. Consequently, decrease in the gate voltage VGA is restarted, the bias signal IB starts increasing, and the phase difference average value PhCmpAv decreases.

In (12), when the gate voltage VGA becomes the low level and the sequence unit 8 shifts to the state S6, the sequence unit 8 outputs the high-level control signal LCLA. The N-type transistor 511 is made conductive and the gate voltage VGA is clamped to the ground potential. As a result, the differential bias signal ΔIB is added to the bias signal IB and the resultant is outputted.

In (13), when the sequence unit 8 shifts to the state S7, the sequence unit 8 outputs the low-level selection control signal SWONA and transmission of the transient control signal CTL to the gate voltage VGA is interrupted. After that, in (14), the sequence unit 8 returns to the state S0.

As described in detail above, in the frequency synthesizer 1A according to the embodiment, when the differential bias unit 5 generates the differential bias signal ΔIB as the difference of the bias signal IB necessary for the oscillation control circuit 2 in accordance with variations in the oscillation frequency band fb, the differential bias unit 5 can be controlled transiently. By performing the control which gradually shifts the bias signal IB, the oscillation frequency band fb can be changed little by little.

According to the invention, the oscillation frequency band fb can be switched step by step continuously. In the transient period in which the oscillation frequency band fb is switched, the state in which the oscillation frequency band fb is switched discontinuously and the frequency synthesizer 1 is unlocked can be suppressed. Also in the transient period in which the oscillation frequency band fb is switched, the lock state can be maintained.

The frequency synthesizer 1 capable of maintaining the lock state also in the transient period in which the oscillation frequency band fb is switched can be realized without making the circuit configuration redundant. With a small-scale circuit configuration, low power consumption current operation can be performed. Further, irrespective of the transient period and the normal state, a stable output signal of the oscillation frequency fo can be outputted.

Obviously, the present invention is not limited to the foregoing embodiment but can be variously improved or modified without departing from the gist of the invention.

For example, although the example that the sequence unit 8 is constructed by hardware controlled in the state transition of FIG. 5 has been described in the embodiment, the invention is not limited to the example. Obviously, the invention can be also similarly applied to the case where the sequence unit 8 is controlled by software by using a CPU, a sequencer, or the like.

The p-type transistor 513 is an example of an output buffer circuit. The P-type transistor 510 and the N-type transistor 511 are an example of a driver circuit. The transient control signal CTL is an example of a multi-stage signal. The selector 4B is an example of a selection circuit. The capacitor 48 is an example of an integrating circuit. The constant current sources 44 and 47, the P-type transistor 45, and the N-type transistor 46 are an example of a charge/discharge circuit. The system clock signal SysClk is an example of a cycle signal. The initial value storing unit 30 and the comparator 33 are an example of a first detection circuit. The comparator 33 is an example of a first comparator. The initial value storing unit 30 is an example of the first storage. The upper limit value storing unit 31 and the comparator 34 are an example of a second detection circuit. The comparator 34 is an example of a second comparator. The lower limit value storing unit 32 and the comparator 35 are an example of a third detection circuit. The comparator 35 is an example of a third comparator. The averaging circuit 6 is an example of a second storage. The comparators 74 and 75 are an example of a fourth comparator.

The present invention can provide the frequency synthesizer capable of switching the oscillation frequency band while maintaining a lock state by supplying the bias signal necessary for oscillation control step by step, realized with a small-scale and low-current-consumption circuit configuration, and the oscillation control method of the frequency synthesizer.

What is claimed is:

1. A frequency synthesizer having an oscillation control circuit capable of switching an oscillation frequency band, comprising:
   a differential bias unit for generating, as a differential bias signal, a difference in bias signals to the oscillation control circuit caused by variations in the oscillation frequency band;
   a band limit detector for detecting that the oscillation frequency exceeds a predetermined value according to the oscillation frequency band; and
   a transient controller for performing control of gradually shifting a bias signal which is outputted, on the differential bias unit in a transient period in which the differential bias unit is controlled in accordance with detection of the band limit detector.

2. The frequency synthesizer according to claim 1, further comprising a transient limit detector for detecting that transition width of the oscillation frequency exceeds predetermined width,
   wherein gradual transition of the bias signal by the transient controller is temporarily stopped in response to the detection of the transient limit detector.

3. The frequency synthesizer according to claim 1, further comprising a sequence unit for instructing a switch process of switching the oscillation frequency band in response to detection of the band limit detector,
   wherein the switch process comprises:
   a step of selecting the differential bias unit on which operation switching is performed;
   a step of initializing the transient controller in accordance with the direction of operation switching of the selected differential bias unit;
   a step of switching control of the selected differential bias unit from normal control performed by the differential bias unit to transient control by the transient controller; and
   a step of switching the transient control performed by the transient controller to the normal control performed by the differential bias unit in response to completion of the operation switching.

4. The frequency synthesizer according to claim 1, wherein the differential bias unit comprises:
   an output buffer circuit for outputting the differential bias signal; and
   a driver circuit for controlling the output buffer circuit to binary states of a state where the differential bias signal is outputted and a state where the differential bias signal is not outputted.

5. The frequency synthesizer according to claim 4, wherein the driver circuit fixes the output buffer circuit to the state where the differential bias signal is outputted or the state where the differential bias signal is not outputted in response to completion of the operation switching of the differential bias unit.

6. The frequency synthesizer according to claim 4, wherein in the transient period of the operation switching of the differential bias unit,
   the driver circuit sets the output buffer circuit to the state where the differential bias signal is not outputted, and the transient controller sets the output buffer circuit to the state where the bias signal is outputted.

7. The frequency synthesizer according to claim 1, wherein the differential bias unit has a first differential bias circuit for outputting a signal that identifies the neighboring oscillation frequency band in the differential bias signals.

8. The frequency synthesizer according to claim 1, wherein the transient controller comprises:
    a signal generating circuit for generating a multistage signal for controlling the differential bias unit; and
    a selection circuit for connecting the signal generating circuit to the differential bias unit on which the operation switching is to be performed.

9. The frequency synthesizer according to claim 8, wherein the signal generating circuit comprises:
    an integrating circuit; and
    a charging/discharging circuit for charging/discharging the integrating circuit.

10. The frequency synthesizer according to claim 1, wherein the band limit detector comprises:
    a first detection circuit for detecting the transition direction of the oscillation frequency; and
    a second detection circuit for detecting that the oscillation frequency exceeds an upper limit value in the oscillation frequency band and/or
    a third detection circuit for detecting that the oscillation frequency is below a lower limit value in the oscillation frequency band, and
    transition of the oscillation frequency exceeding the limit value is detected by detection of increase in frequency by the first detection circuit and detection of the second detection circuit that the frequency is higher than the upper limit value and/or detection of decrease in frequency of the first detection circuit and detection of the third detection circuit that the frequency is below the lower limit value.

11. The frequency synthesizer according to claim 10, further comprising a phase comparator for comparing the phase of a reference signal and the phase of an output signal,
    wherein the first detection circuit comprises:
    a first storage that stores a result of comparison performed by the phase comparator in the normal state where the output signal is locked to the reference signal; and
    a first comparator for comparing a comparison result stored in the first storage with a comparison result of the phase comparator.

12. The frequency synthesizer according to claim 10, further comprising a phase comparator for comparing phases of the reference signal and the output signal,
    wherein the second or third detection circuit comprises a second or third comparator for comparing the upper limit value or the lower limit value with a comparison result of the phase comparator.

13. The frequency synthesizer according to claim 2, further comprising a phase comparator for comparing phases of a reference signal and an output signal,
    wherein the transition limit detector comprises:
    a second storage that stores a preceding comparison result of the phase comparator; and
    a fourth comparator for comparing the preceding comparison result stored in the second storage with a comparison result of the phase comparator, and
    the predetermined value is a predetermined upper limit value and/or a predetermined lower limit value of the preceding comparison result.

14. The frequency synthesizer according to claim 11, further comprising an averaging circuit for averaging output signals from the phase comparator,
    wherein the comparison result is outputted from the averaging circuit.

15. An oscillation control method of a frequency synthesizer capable of switching an oscillation frequency band, comprising:
    a step of detecting that the oscillation frequency exceeds a predetermined value according to the oscillation frequency band; and
    a step of gradually shifting a bias signal which sets the oscillation frequency band in accordance with the step of detecting the band.

16. The oscillation control method of a frequency synthesizer according to claim 15, further comprising a step of detecting that transition width of the oscillation frequency exceeds predetermined width,
    wherein the gradual transition step is temporarily stopped in accordance with the transition detecting step.

17. The oscillation control method of a frequency synthesizer according to claim 15, wherein the gradual transition step comprises:
    a step of determining a differential bias signal necessary for switching the oscillation frequency band;
    a step of initializing the bias signal in accordance with the determined differential bias signal; and
    a step of gradually shifting the initialized bias signal toward the differential bias signal.

18. The oscillation control method of a frequency synthesizer according to claim 15, wherein the step of detecting the band comprises:
    a step of detecting the transition direction of the oscillation frequency; and
    a step of detecting that the oscillation frequency exceeds an upper limit value in the oscillation frequency band and/or a step of detecting that the oscillation frequency is below a lower limit value in the oscillation frequency band, and
    transition of the oscillation frequency exceeding the limit value is detected by a step of detecting increase in frequency by the transition direction detecting step and detecting that the frequency is higher than the upper limit value and/or a step of detecting decrease in frequency by the transition direction detecting step and detecting that the frequency is lower than the lower limit value.

19. The oscillation control method of a frequency synthesizer according to claim 18, further comprising a step of comparing the phase of a reference signal and the phase of an output signal,
    wherein the step of detecting the transition direction of the oscillation frequency comprises:
    a step of storing a result of the phase comparison performed in a normal state where the output signal is locked to the reference signal; and
    a step of comparing a comparison result stored in the step of storing the comparison result with the comparison result in the phase comparing step.

20. The oscillation control method of a frequency synthesizer according to claim 16, further comprising a step of comparing phases of the reference signal and the output signal,
    wherein the step of detecting the transition comprises:
    a step of storing a preceding comparison result in the phase comparing step; and
    a step of comparing the preceding comparison result stored in the step of storing the preceding phase comparison with the comparison result in the phase comparison step.

* * * * *